United States Patent [19]

Muraoka et al.

[11] 4,211,979
[45] Jul. 8, 1980

[54] CIRCUIT ARRANGEMENT FOR ELIMINATING WAVEFORM DISTORTION OF AN ANGLE-MODULATED SIGNAL TRANSMITTED OVER MULTIPATHS

[75] Inventors: Teruo Muraoka; Masami Yamazaki; Yukinobu Ishigaki, all of Yokohama, Japan

[73] Assignee: Victor Company of Japan, Limited, Yokohama, Japan

[21] Appl. No.: 919,744

[22] Filed: Jun. 28, 1978

[30] Foreign Application Priority Data

Jun. 29, 1977 [JP] Japan ................................. 52-77558

[51] Int. Cl.$^2$ ............................................... H04B 1/12
[52] U.S. Cl. ............................................... 455/306
[58] Field of Search ................. 325/472, 473, 474, 475

[56] References Cited

U.S. PATENT DOCUMENTS

| 3,168,699 | 2/1965 | Sunstein | 325/472 |
|---|---|---|---|
| 3,293,551 | 12/1966 | Ehrich | 325/474 |
| 3,537,008 | 10/1970 | Lakatos | 325/474 |
| 3,611,169 | 10/1971 | Hess | 325/475 |

Primary Examiner—David L. Stewart
Attorney, Agent, or Firm—Lowe, King, Price & Becker

[57] ABSTRACT

An FM wave received by an antenna is fed via an AGC circuit to a first FM demodulator and to a compensation signal generator which includes an envelope signal generator, a capacitor, a function generator, an analog multiplier, an SSB modulator, and a second FM demodulator so that the output signal of the compensation signal generator is added to the output signal obtained by the first FM demodulator to offset the multipath distortion contained in the received FM wave.

16 Claims, 6 Drawing Figures

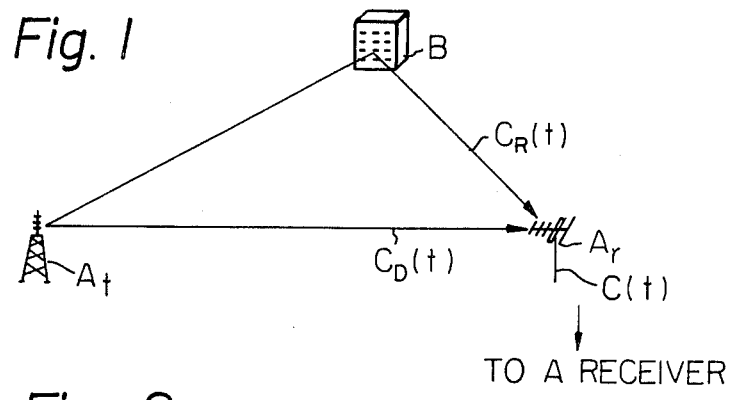
Fig. 1
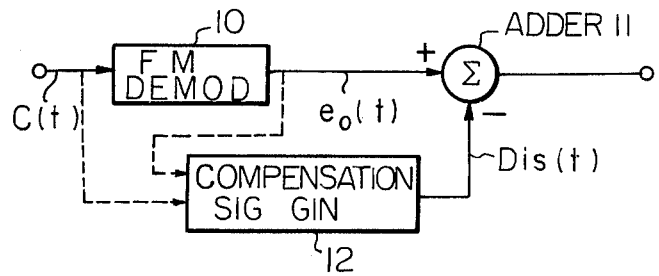
Fig. 2
Fig. 5
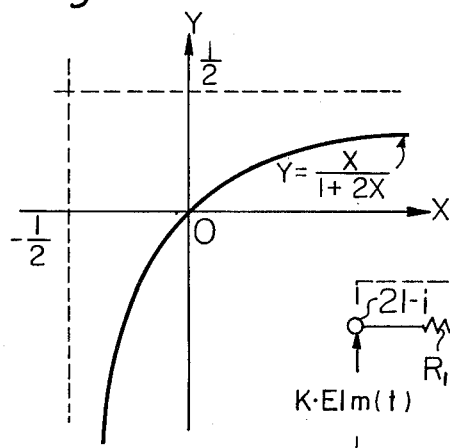
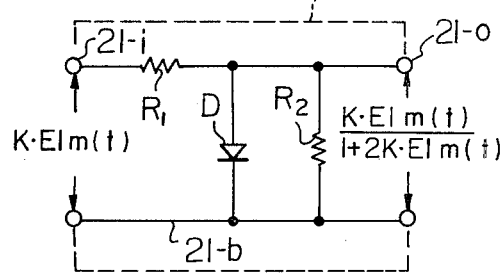
Fig. 6

CIRCUIT ARRANGEMENT FOR ELIMINATING WAVEFORM DISTORTION OF AN ANGLE-MODULATED SIGNAL TRANSMITTED OVER MULTIPATHS

FIELD OF THE INVENTION

This invention generally relates to a compensation circuit for the multipath distortion of received electromagnetic radio waves. More specifically, the present invention relates to such a compensation circuit for angle modulated, e.g., FM (frequency-modulated) radio waves.

BACKGROUND OF THE INVENTION

When an angle modulated, e.g., FM, radio wave transmitted from a transmitting antenna reaches a receiving antenna via more than one different propagation path, interference may occur between the received signals. The interference is apt to cause the received signal to have a distortion therein. In other words, the distortion (which is referred to as interference distortion hereinafter) of the received signal occurs since both a direct wave and an indirect wave, such as a reflected wave and/or a diffracted wave, are received by the same receiving antenna. The interference distortion which occurs due to the above mentioned reason is called a multipath distortion. The occurrence possibility of multipath distortion is relatively high in cities having tall buildings.

A method which has been adopted to reduce or cancel multipath distortion is to use a receiving antenna which has a sharp directivity for receiving only the direct wave or a wave which is aimed to receive. However, this method does not work effectively when many tall buildings surround a receiving point. Therefore, a compensation circuit for cancelling or reducing the distortion may be provided. Such a circuit is called a multipath distortion compensation circuit.

PRIOR ART

Multipath distortion compensation circuits are frequently arranged so that the influence of an unwanted wave, such as the reflected wave and/or a diffracted wave, is cancelled. In order to cancel the distortion due to the unwanted signal, the compensation circuit is connected before or after an FM demodulator. In both cases, the multipath distortion compensation circuit requires a delay element or circuit having a delay time which corresponds to the time delay of the unwanted signal with respect to the direct wave. If the compensation circuit is connected before the FM demodulator, a delay element which can provide a sufficient time delay for a high frequency radio wave is required. However, it is extremely difficult to produce such an element. On the other hand when a delay element is connected after the FM demodulator, a readily available delay element can be used because it need provide a sufficient time delay for only a relatively low information frequency, such as audio frequency. However, the latter delay element has problems with respect to the dyanmic range and cost thereof.

Another reason why such conventional multipath distortion compensation circuits are not practical concerns the difference in the propagation distances between the direct and unwanted waves. Because the difference in propagation distances between the direct and unwanted waves is not uniform at different receiving points, the time delay of the delay element or circuit must be set for different receivers at different locations. Otherwise, there is inaccurate cancelling or offsetting of the unwanted wave. Moreover, if the receiver responds to a different radio wave which is transmitted from a different position, the time delay should be adjusted to match with the time delay of the unwanted wave. Therefore, each time the operator or the listener of the FM radio receiver tunes to a different radio wave transmitted from a different point, he must adjust the time delay of a variable delay element or circuit, included in the compensation circuit. From the foregoing description it will be understood that a compensation circuit requiring a delay element or circuit, is impractical and inconvenient.

SUMMARY OF THE INVENTION

The present invention has been developed in order to overcome the above mentioned drawbacks of the conventional type of multipath distortion compensation circuit.

It is therefore an object of the present invention to provide an improved compensation circuit for eliminating waveform distortion of an angle modulated, e.g., an FM, signal in which no delay element or circuit is required.

Another object of the present invention is to provide such a compensation circuit which can be utilized without any adjustment.

According to the present invention there is provided a circuit arrangement for eliminating waveform distortion of an angle modulated, e.g. frequency-modulated, signal subject to multipath distortion, comprising:
(a) an automatic gain controlled amplifier responsive to the angle modulated signal for producing a gain controlled angle signal, said gain controlled FM signal being supplied to a first angle demodulator; (b) an envelope signal generator responsive to the automatic gain controlled amplifier for producing a first signal in accordance with the envelope level of the gain controlled angle signal derived from the automatic gain controlled amplifier; (c) DC component blocking means connected to the output of the envelope signal generator for permitting transmission of only the AC component of the first signal; (d) a function generator operatively connected to the DC component blocking means for producing a second signal $Y$ expressed by $Y = X/(1+2X)$ wherein $X$ is the input signal thereof; (e) occupied-frequency shifting means connected to the DC component blocking means for shifting the occupied-frequency of the AC component of the first signal to a predetermined extent; (f) second angle demodulator connected to the occupied-frequency shifting means for producing a third signal; (g) an analog multiplier having first and second inputs respectively connected to the output of the function generator and to the second angle demodulator, the analog multiplier producing a signal representing the product of the second and third signals; (h) an adder having first and second inputs respectively connected to the output of the first angle demodulator and to the output of the analog multiplier, for adding the product signal obtained by the analog multiplier to a demodulated signal derived from the first angle demodulator.

Further according to the present invention there is also provided a method of eliminating multipath waveform distortion of an angle modulated signal, comprising the steps of:
(a) producing a gain controlled angle modulated signal by maintaining the average amplitude of the angle modulated signal substantially constant; (b) producing a first signal based on the envelope level of the gain controlled angle modulated signal; (c) blocking the DC component of the first signal; to permit coupling of only the AC component of the first signal; (d) producing a second signal expressed by $Y=1/1+2X$ where X is the amplitude of the AC component of the first signal and Y is the amplitude of the second signal; (e) shifting the occupied-frequency of the AC component of the first signal to a predetermined extent; (f) demodulating the shifted signal to produce a third signal; (g) multiplying the second signal by the third signal to produce signal representing the a product thereof; (h) demodulating the gain controlled angle modulated signal to produce a fourth signal; and (i) adding the product signal to the fourth signal to obtain a demodulated signal which does not include multipath distortion.

BRIEF DESCRIPTION OF THE DRAWINGS

The objects and features of the present invention will become readily apparent from the following detailed description taken in conjunction with the appended drawings in which:

FIG. 1 is a schematic view of the propagation of an FM radio wave;

FIG. 2 is a schematic, operational block diagram of the multipath distortion compensation circuit according to the present invention for the sake of explanation of the general concept of the compensation;

FIG. 5 is a graph of the input-output characteristics of function generator 21 shown in FIGS. 3 and 4; and FIG. 6 is a detailed circuit of the function generator shown in FIGS. 3 and 4.

DETAILED DESCRIPTION OF THE PREFERRED EMBODIMENTS

Figure 3:
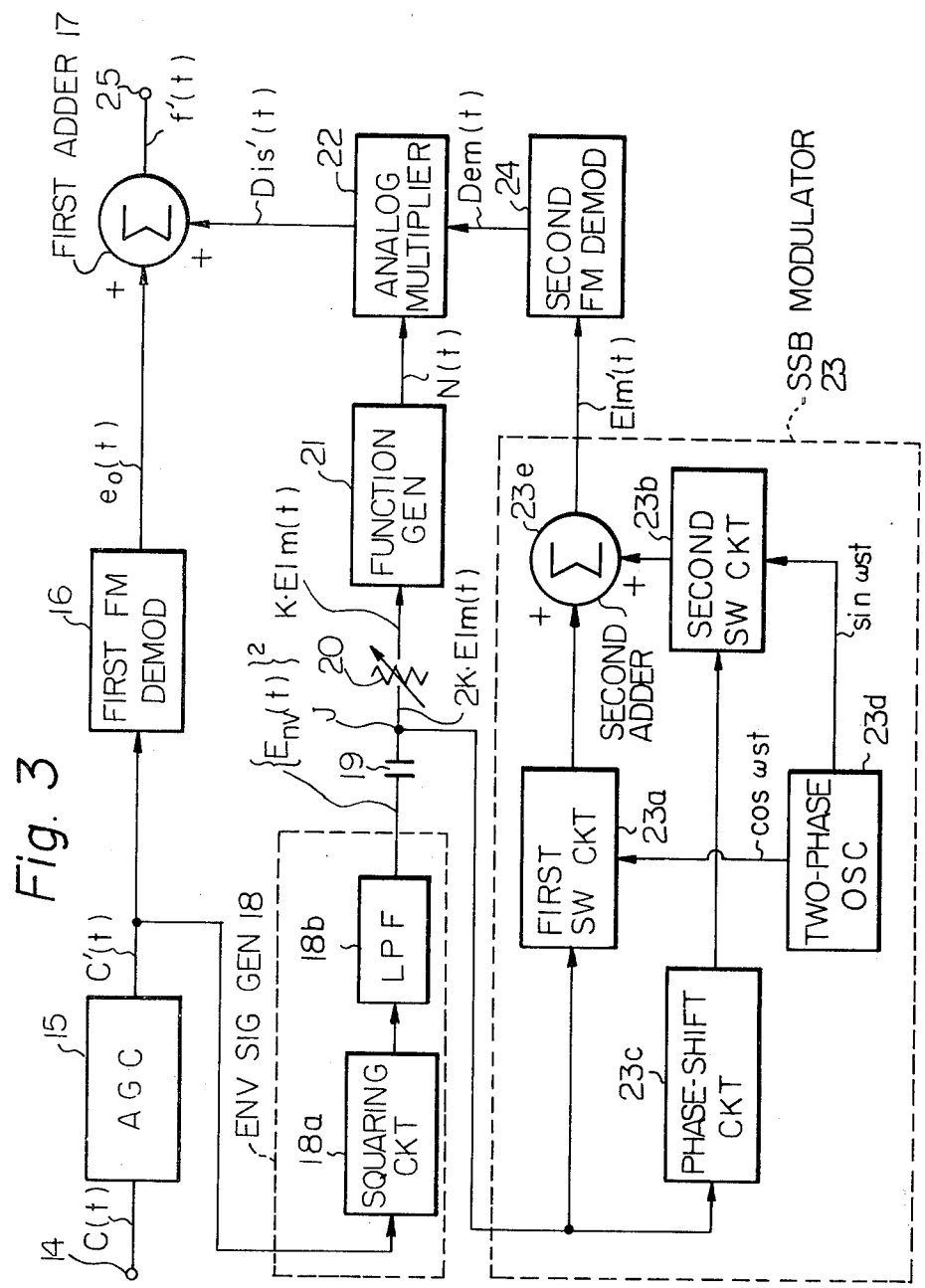
FIG. 3 is in a block diagram of a first preferred embodiment of the multipath distortion compensation circuit according to the present invention.

Prior to the detailed description of the preferred embodiments, a discussion of the theory of the multipath distortion compensation circuit according to the present invention will be made. The following discussion is directed to FM waves, but it is to be understood that it is applicable to any type of angle modulated wave that is normally transmitted with constant amplitude, i.e., to FM and phase modulated waves.

FIG. 1 is a schematic view of the propagation of an angle modulated, e.g., FM, (frequency-modulated) wave. Transmitting antenna "At" derives an FM wave that is received by receiving antenna "Ar" via a direct path $C_D(t)$ and an indirect path including a reflecting solid, such as tall building "B". Since two radio waves are received by antenna "Ar" via different propagation paths, i.e. direct wave $C_D(t)$ and reflected wave $C_R(t)$, the receiving antenna "Ar" reproduces a wave C(t) which is a composite signal of the two waves $C_D(t)$ and $C_R(t)$.

Assume that the frequency of the carrier wave of the FM wave $\omega c$, the modulation signal is f(t), and the time delay of the indirect wave $C_R(t)$ due to the difference in propagation distances with respect to that of the direct wave $C_R(t)$ is $\tau$. Hence direct wave $C_D(t)$, the reflected wave $C_R(t)$ and the composite signal C(t) can be respectively expressed by the following formulas:

$$C_D(t) = \cos\{\omega_c t + f(t)\} \qquad (1)$$
$$C_R(t) = K \cos\{\omega_c t + f(t - \tau) - \omega_c \tau\} \qquad (2)$$
$$= K \cos\{\omega_c t + f(t - \tau) - \theta\}$$
$$C(t) = C_D(t) + C_R(t) \qquad (3)$$
$$= E_{nv}(t) \cos\{\omega_c t + f(t) + \phi(t)\}$$

In the above Eq. (3), Env(t) indicates the amplitude variation of the composition signal C(t) where the variation occurs due to the interference of the direct wave $C_D(t)$ by the indirect wave $C_R(t)$ while $\phi(t)$ indicates the phase variation and K indicates the interference ratio. The functions Env(t) and $\phi(t)$ are expressed by the following equations.

$$Env(t) = \sqrt{1 + K^2 + 2K \cos\{f(t) - f(t - \tau) + \theta\}} \qquad (4)$$

$$\phi(t) = -\tan^{-1} \frac{K\sin\{f(t) - f(t - \tau) + \theta\}}{1 + K\cos\{f(t) - f(t - \tau) + \theta\}} \qquad (5)$$

Meanwhile when the composite FM signal C(t) is demodulated by a FM demodulator, the demodulated signal $e_o(t)$ is expressed by the following equation wherein $$f'(t) = \frac{df(t)}{dt} \text{ and } \phi'(t) = \frac{d\phi(t)}{dt}: \qquad (6)$$
$$e_o(t) = f'(t) + \phi'(t)$$

From Eq. (6) it is apparent that the demodulated signal $e_o(t)$ includes not only an essential component f'(t) as well as an interference distortion component $\phi'(t)$. If the component $\phi'(t)$, included in the above Eq. (6) is expressed in terms of Dis(t), Dis(t) is expressed by the following equation.

$$\phi'(t) \equiv Dis(t) \approx \frac{K\{f'(t - \tau) - f'(t)\}\cos\{f(t) - f(t - \tau) + \theta\}}{1 + K^2 + 2K\cos\{f(t) - f(t - \tau) + \theta\}} \qquad (7)$$

Therefore, when it is desired to obtain a demodulated signal f'(t) which does not include any distortion, it will be understood that a component expressed by Dis(t) should be subtracted from the demodulated signal expressed by $e_o(t)$.

Reference is now made to FIG. 2, a schematic, operational block diagram of the multipath distortion compensation circuit according to the present invention. The compensation circuit includes an FM demodulator 10, a compensation signal generator 12, and an adder 11. An input of the compensation signal generator 12 is connected to either the input or output of the FM demodulator 10. The output of the FM demodulator 10 is connected to a +input of the adder 11 while the output of the compensation signal generator 12 is connected to the −input of the adder 11. The input of the FM demodulator 10 responds to the composite FM signal C(t) so that the FM demodulator 10 produces a demodulated signal $e_o(t)$. Therefore, in order to cancel or offset the interference distortion contained in the demodulated signal $e_o(t)$, the compensation signal generator 12 is required to produce a signal expressed by Dis(t). Since the adder 11 functions as a subtractor, a demodulator signal f'(t) is obtained at the output of the adder 11. In the foregoing description the general function of the compensation circuit is described. Hereinafter a discussion of the technique to produce the compensation or offset signal Dis(t) in response to the composite FM signal C(t) received by an antenna is described.

Analysing the components included in the interference distortion indicated by the Eq. (7), it can be seen that the denominator of the Eq. (7) is equal to the sqaure of the envelope Env(t), expressed by the Eq. (4), of the amplitude variation of the received FM radio wave C(t) and that the component $K \cos\{f(t)-f(t-\tau)+\theta\}$ of the numerator of the Eq. (7) can be derived from the envelope Env(t) of the amplitude variation of the FM wave signal C(t).

However, it is essential to produce a signal which corresponds to the component f'(t−τ) included in the components $\{f'(t-\tau)-f'(t)\}$ of the numerator of the Eq. (7). In order to produce the component f'(t−τ) a delay element is usually required since the component f'(t−τ) includes a time delay. According to the present invention such a delay element is not employed for obtaining the above mentioned component $\{f'(t-\tau)-f'(t)\}$. Namely, according to the present invention in view of the component $\cos\{f(t)-f(t-\tau)+\theta\}$ which is readily derived from the envelope Env(t) of the amplitude variation of the FM wave signal C(t), the above mentioned component $\{f'(t-\tau)-f'(t)\}$ is derived. The detailed method of the production of the component will be described hereinbelow.

First of all aforementioned component $\cos\{f(t)-f(t-\tau)+\theta\}$ is replaced by Elm(t) as follows:

$$\text{Elm}(t)=\cos\{f(t)-f(t-\tau)+\theta\} \quad (8)$$

As indicated by Eq. (8), the signal expressed by Elm(t) is an angle modulated wave having a zero carrier frequency and a modulation signal represented by $\{f(t)-f(t-\tau)\}$. When signal Elm(t) is demodulated, a demodulated signal expressed by $\{f'(t)-f'(t-\tau)\}$ may be obtained in theory. However, since the carrier frequency of the signal Elm(t) is zero, such a direct FM demodulation is impossible.

According to the present invention, a demodulated signal $\{f'(t)-f'(t-\tau)\}$ is obtained by FM demodulation after the occupied band of the signal Elm(t) is shifted to a given extent. Namely, when the signal Elm(t) is shifted as much as $\omega_s$ by means of SSB modulation, there is derived a signal Elm'(t):

$$\text{Elm}'(t)=\cos\{\omega_s+f(t)-f(t-\tau)+\theta\} \quad (9)$$

When the signal expressed by Eq. (9) is demodulated by an FM demodulator or a detector, a demodulated signal Dem(t) is obtained as follows:

$$\text{Dem}(t)=f'(t)-f'(t-\tau) \quad (10)$$

A component which corresponds to the interference distortion Dis(t) is produced, based on the demodulated signal Dem(t), a signal Elm(t) and the envelope Env(t) of the amplitude variation of the composite FM wave C(t). The component of the interference distortion is expressed by the following formula:

$$Dis(t) = \frac{-K \cdot Elm(t) \cdot Dem(t)}{\{Env(t)\}^2} \quad (11)$$

Hence, reference is now made to FIG. 3 which shows a first preferred embodiment of the multipath distortion compensation circuit according to the present invention. The compensation circuit includes an AGC (automatic gain controlled) amplifier 15, a first FM demodulator 16, a first adder 17, an envelope level signal generator 18, a capacitor 19, a variable resistor 20, a function generator 21, an analog multiplier 22, a SSB (single-sideband) modulator 23, and a second FM demodulator 24. It will be noticed that the combination of the envelope signal generator 18, the capacitor 19, the variable resistor 20, the function generator 21, the analog multiplier 22, the SSB modulator 23, and the second FM demodulator 24 corresponds to the compensation signal generator 12 shown in FIG. 2.

A radio wave C(t) received by the receiving antenna "Ar" shown in FIG. 1 is supplied via a suitable tuning circuit (not shown) to an input terminal 14 which is connected to an input of the AGC amplifier 15. If desired, a frequency converter and an IF (intermediate-frequency) amplifier may be interposed between the tuning circuit and the AGC amplifier 15. However, the AGC amplifier 15 may be included in an IF amplifier. The output of the AGC amplifier 15 is connected to an input of the first FM demodulator 16 and to an input of the envelope signal generator 18. The amplitude of the received radio wave C(t) is automatically controlled by the AGC amplifier 15 for maintaining the average amplitude constant so that a controlled FM signal denoted by C'(t), is fed to the envelope level signal generator 18 and to the first FM demodulator 16. The envelope signal generator 18 produces an output signal in accordance with the envelope of the amplitude variation of the FM signal C'(t). The output of the envelope signal generator 18 is connected via the capacitor 19 and the variable resistor 20 to the input of the function generator 21. A junction "J" between the capacitor 19 and the variable resistor 20 is connected to the input of SSB modulator 23. The capacitor 19 blocks a DC component included in the output signal of the envelope signal generator 18 while the variable resistor 20 functions as an attenuation circuit. The function generator 21 is arranged to generate an output signal expressed by $Y=X/(1+2X)$ wherein Y is the magnitude of the output signal of the function generator 21 and X is the magnitude of the input signal of the same.

The controlled FM signal C'(t) fed to and demodulated by the first FM demodulator 16 so that a demodulated signal $e_o(t)$ is obtained at the output of the first FM demodulator 16. The demodulated signal $e_o(t)$ is then supplied to a first+input of the adder 17. The first adder 17 produces an output signal by adding the demodulated signal $e_o(t)$ and another signal which is applied to a second+input thereof. With this arrangement, an output signal, i.e. an added signal, f'(t) is obtained at the output terminal 25 connected to the output of the first adder 17.

On the other hand, the controlled FM signal C'(t) applied to the envelope signal generator 18 is converted into an envelope signal $\{Env(t)\}^2$ which corresponds to the square of the envelope of the amplitude variation of the FM signal C'(t) by the same. The output signal, i.e. the envelope signal $\{Env(t)\}^2$, of the envelope signal generator 18 is respectively applied to the variable resistor 20 and to the SSB modulator 23 via a capacitor 19 so that only the AC component of the envelope signal $\{Env(t)\}^2$ is fed to the resistor and SSB modulator. The AC envelope signal component is attenuated by the variable resistor 20 and applied to the function generator 21. The function generator 21 generates an output signal N(t) in accordance with the attenuated envelope signal. The output signal N(t) of the function generator 21 is fed to one input of the analog multiplier 22.

The AC envelope component is SSB modulated by SSB modulator 23 and thence applied to an input of the second FM demodulator 24. The SSB modulated output signal of modulator 23 is demodulated by second FM demodulator 24 to derive the demodulated signal Dem(t) which is fed to the other input of the analog multiplier 22. The analog multiplier 22 multiplies output signal N(t) of function generator 21 by signal Dem(t) to produce a product signal Dis'(t) which is fed to the second +input of the first adder 17.

The above described construction and the operation of the multipath distortion compensation circuit according to the present invention is a brief description. A detailed description of the construction and the function of the envelope signal generator 18 and the SSB modulator is made infra.

The envelope signal generator 18 includes a squaring circuit 18a and a low-pass filter (LPF) 18b. The FM signal C'(t) is applied to the input of the squaring circuit 18a which derives a squared FM signal. The squared FM signal is then applied to the LPF 18b so that only a low frequency component of the squared FM signal is obtained at the output terminal of the LPF 18b. The output signal of the LPF 18b includes a DC component, that is blocked by the capacitor 19 connected to the output of the LPF 18b. Therefore, only an AC component of the low-frequency component of the FM signal is applied via the variable resistor 20 to the function generator 21. Since the envelope level of the FM signal C'(t) is expressed by the Eq. (4), the output signal of the envelope signal generator 18 is expressed by:

$$\{Env(t)\}^2 = 1 + K^2 + 2K\cos\{f(t) - f(t - \tau) + \theta\} \quad (12)$$
$$= 1 + K^2 + 2K \cdot Elm(t)$$

In the above Eq. (12) the DC component is expressed by $(1+K^2)$. Therefore, when the output signal of the envelope signal generator 18 is applied to the capacitor 19, the output signal of the capacitor 19 is expressed by:

$$2K \cdot Elm(t) \quad (13)$$

The signal expressed by the above formula (13) is respectively fed to the variable resistor 20 and to the input of the SSB modulator 23.

If the amplitude attenuation radio of the variable resistor 20 is ½, the signal supplied to the input of function generator 21 is expressed by:

$$K \cdot Elm(t) \quad (14)$$

Since the function generator 21 is arranged to generate an output signal expressed by $Y = X/(1+2X)$ wherein Y is the output signal and X is the input signal thereof, the function generator 21 generates an output signal N(t) expressed by the following Eq. (15):

$$N(t) = \frac{K \cdot Elm(t)}{1 + 2K \cdot Elm(t)} \quad (15)$$

FIG. 6 is a detailed circuit diagram of the function generator 21 shown in FIG. 3. The function generator 21 includes first series resistor $R_1$, shunt resistor $R_2$, and shunt diode D. The first resistor $R_1$ is interposed between an input terminal 21-i and an output terminal 21-o. The anode of the diode D is connected to the output terminal 21-o while the cathode of the same is connected to a bus line 21-b. The second resistor $R_2$ is connected in parallel with the diode D. As shown in FIG. 6, when an input signal K·Elm(t) is applied to the input terminal 21-i, an output signal expressed by $$\frac{K \cdot Elm(t)}{1 + 2K \cdot Elm(t)}$$

is obtained at the output terminal 21-o.

FIG. 5 is a graph of the input to output characteristics of the function generator 21. In order to obtain an approximation of the characteristics shown in FIG. 5, the resistances of the first and second resistors $R_1$ and $R_2$ and the characteristics of the diode D are suitably selected.

The SSB modulator 23 is utilized to produce an occupied-frequency-shifted signal, having a shift degree $\omega s$ from the signal expressed by 2K·Elm(t). The SSB modulator 23 includes a first and second switching circuits 23a and 23b, a 90° phase-shift circuit 23c, a two-phase oscillator 23d and a second adder 23e. The frequency of the output signals of the two-phase oscillator 23d is $\omega s$ and the signal 2K·Elm(t) is arranged to be shifted by $\omega s$. It is possible, of course, to use other types of SSB modulator. Moreover, not only an SSB modulator but any other circuit which produces an occupied-frequency-shifted signal in response to an input signal may be used instead.

The inputs of the first switching circuit 23a and phase-shift circuit 23c are connected to respond in parallel to the signal at junction "J", between capacitor 19 and variable resistor 20, as expressed by 2K·Elm(t). The output of the first switching circuit 23a is connected to a first + input of the second adder 23e. The output of the phase-shift circuit 23c is connected to an input of the second switching circuit 23b. A first output signal $\cos \omega_s t$ of the two-phase oscillator 23d is supplied to the first switching circuit 23a to control switching of the input signal of the first switching circuit 23a while a second output signal $\sin \omega_s t$ of the two-phase oscillator 23d is supplied to the second switching circuit 23b for switching the input signal of the second switching circuit 23b. The output of the second switching circuit 23b is connected to a second + input of the second adder 23e. The output of the second adder 23e is connected to the input of the second FM demodulator 24.

With this provision the second adder 23e produces an output signal Elm'(t) which is defined by the Eq. (9). The signal Elm'(t) is demodulated by the second FM demodulator 24 and thus an output signal Dem(t) which is defined by the Eq. (10) is obtained at the output of the second FM demodulator 24.

Consequently, the output signal Dem(t) of the second FM demodulator 24 and the aforementioned signal N(t) derived from the function generator 21 are respectively fed to the analog multiplier 22. The analog multiplier multiplies the signal Dem(t) by the other signal N(t). The product of Dem(t) and N(t) is expressed by the following equation.

$$Dis'(t) = N(t) \cdot Dem(t) \quad (16)$$
$$= \frac{K\{f'(t) - f'(t-\tau)\}\cos\{f(t) - f(t-\tau) + \theta\}}{1 + 2K\cos\{f(t) - f(t-\tau) + \theta\}}$$

From Eq. (12) it can be seen that the denominator of the Eq. (16) corresponds to:

$$\{Env(t)\}^2 - K^2 \quad (17)$$

When K is much less than 1, the value of $K^2$ is substantially negligible, so the relationship between the interference distortion component expressed by Eq. (7) and the interference distortion offset signal expressed by the Eq. (16) can be represented as:

$$Dis'(t) = -Dis(t) \quad (18)$$

As mentioned before, the first adder 17 is supplied with the demodulated signal $e_o(t)$ and the product Dis'(t) of the above mentioned multiplication. Therefore, by adding these two signals to each other, the first adder 17 produces an output signal f'(t) which is expressed by:

$$e_o(t) + Dis'(t) = e_o(t) - Dis(t) = f'(t) \quad (19)$$

From the foregoing it will be clearly understood that the output signal f'(t) of the first adder 17 obtained at the output terminal 25 does not include any distortion component. Hence the interference distortion due to the unwanted wave $C_R(t)$ is compensated by means of suitable offset signal Dis'(t).

Figure 4:
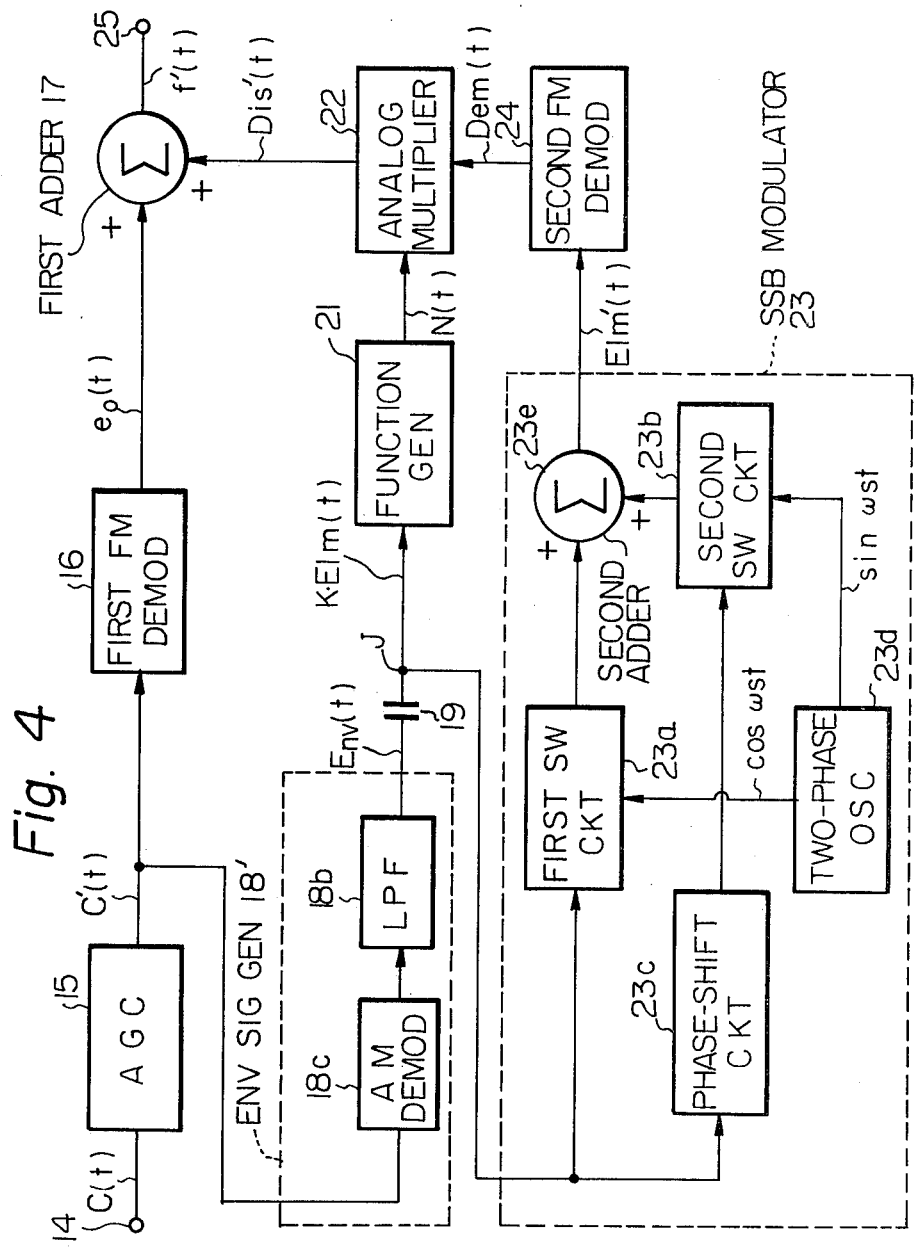
FIG. 4 is in a block diagram of a second preferred embodiment of the multipath distortion compensation circuit according to the present invention.

Reference is now made to FIG. 4 a block diagram of a second preferred embodiment of the multipath distortion compensation circuit according to the present invention. The compensation circuit shown in FIG. 4 has the same construction as that of the first preferred embodiment shown in FIG. 3 except that an amplitude demodulator 18c is used instead of the squaring circuit 18a, and the variable resistor 20 is omitted.

Namely, the envelope signal generator 18' includes an amplitude demodulator 18c and a LPF 18b, while the output of the LPF 18b is connected via the capacitor 19 to the input of the function generator 21. The same elements and circuits in the second embodiment are denoted by like numerals as in the first embodiment.

The envelope signal generator 18' produces an envelope signal Env(t) expressed by the Eq. (4). However, if the value of $K^2$ is negligible, the equation (4) can be simplified by the following approximation.

$$\begin{aligned} Env(t) &\approx 1 + K \cos\{f(t) - f(t-\tau) + \theta\} \\ &= 1 + K \cdot Elm(t) \end{aligned} \quad (20)$$

In the above Eq. (20), 1 indicates a DC component contained in the output signal Env(t) of the envelope signal generator 18'. Since the DC component is blocked by the capacitor 19, the signal applied in parallel to the function generator 21 and to the SSB modulator 23 is represented as:

$$K \cdot Elm(t) \quad (21)$$

From the foregoing it will be understood that the signal K·Elm(t) applied to the SSB modulator 23 of the second embodiment and the signal 2K·$E_{lm}$(t) which is fed to modulator 23 of the first embodiment are different from each other only in the amplitudes thereof. In other words, the angle modulation components of these two signals 2K·Elm(t) and K·Elm(t) applied to the SSB modulator 23 in the both embodiments are the same. Therefore, the SSB modulator 23 of the second embodiment functions in the same manner as in the first embodiment. Consequently, the second adder 23e produces an output signal Elm'(t) in the same manner so that the following stages of the second embodiment function in the same manner as described hereinbefore.

It will be apparent from the above described detailed description of the preferred embodiment of the multipath distortion compensation circuit according to the present invention that a delay element which is inherent to the conventional type of a compensation circuit is not required in the compensation circuit according to the present invention. Since such a delay element is usually expensive, the compensation circuit according to the present invention can be manufactured with a lower cost than a conventional circuit. Moreover, there is no need to adjust any elements of the compensation circuit in accordance with the receiving point and a receiving radio wave. Further, an FM receiver utilizing the compensation circuit according to the present invention effectively receives FM radio waves. Especially, in case that the FM receiver operates under poor propagation conditions, that the receiving efficiency of the FM receiver is remarkably improved compared to the conventional type.

Obviously more modifications and variations of the present invention are possible in the light of the above teachings. It is therefore to be understood that within the scope of the appended claims the invention may be practiced otherwise than as specifically described.

What is claimed is:

1. A circuit arrangement capable of eliminating multipath waveform distortion of an angle modulated signal, comprising:
   (a) an automatic gain controlled amplifier responsive to said angle modulated signal for producing a gain controlled, angle modulated signal having a substantially constant average magnitude, said gain controlled, angle modulated signal being supplied to a first angle modulation demodulator;
   (b) an envelope signal generator responsive to said automatic gain controlled amplifier for producing a first signal in accordance with the envelope level of the gain controlled, angle modulated signal derived from said automatic gain controlled amplifier;
   (c) DC component blocking means responsive to the output of said envelope signal generator for coupling only the AC component of said first signal to an output thereof;
   (d) a function generator responsive to said AC component for producing a second signal Y having an amplitude expressed by $Y = X/(1+2X)$ wherein X is the amplitude of the input signal thereof;
   (e) occupied-frequency shifting means responsive to said AC component for shifting the occupied-frequency of said AC component of said first signal to a predetermined extent;
   (f) second angle modulation demodulator responsive to said occupied-frequency shifting means for producing a third signal;
   (g) an analog multiplier having first and second inputs respectively responsive to the output of said function generator and to said second angle modulation demodulator, said analog multiplier producing a product of said second and third signals;
   (h) an adder having first and second inputs respectively responsive to the output of said first angle modulation demodulator and to the output of said analog multiplier, for adding said product obtained by said analog multiplier to a demodulated signal derived from said first angle modulation demodulator.

2. A circuit arrangement as claimed in claim 1, wherein said envelope signal generator comprises: a squaring circuit for producing a squared angle signal in accordance with said gain controlled angle modulated signal; and a low-pass filter responsive to said squaring circuit for passing only the low-frequency component of said squared FM signal.

3. A circuit arrangement as claimed in claim 2, further comprising an attenuating means interposed between said DC component blocking means and said function generator.

4. A circuit arrangement as claimed in claim 1, wherein said envelope signal generator comprises: an amplitude demodulator for demodulating said gain controlled angle modulated signal; and a low-pass filter responsive to said amplitude demodulator for passing only the low-frequency component of the demodulated signal.

5. A circuit arrangement as claimed in claim 1, wherein said function generator comprises: a first series resistor connected between an input terminal and an output terminal; a shunt diode having an anode connected to said output terminal and a cathode connected to a bus line; and a second shunt resistor connected across the output terminal and said bus line.

6. A circuit arrangement as claimed in claim 1, wherein said occupied-frequency shifting means comprises: a single sideband modulator.

7. A method of eliminating multipath waveform distortion of an angle modulated signal, comprising the steps of:
 (a) producing a gain controlled, angle modulated signal by maintaining the average amplitude of said angle modulated signal constant;
 (b) producing a first signal based on the envelope level of said gain controlled, angle modulated signal;
 (c) blocking the DC component of said first signal to permit transmission of only the AC component of said first signal;
 (d) producing a second signal expressed by $Y=X/(1+2X)$ wherein X is the amplitude of the AC component of said first signal and Y is the amplitude of said second signal;
 (e) shifting an occupied-frequency of said AC component of said first signal to a predetermined extent;
 (f) demodulating the shifted signal to produce a third signal;
 (g) multiplying said second signal by said third signal to produce a signal representing the product thereof;
 (h) demodulating said gain controlled, angle modulated signal to produce a fourth signal; and
 (i) adding said product representing signal to said fourth signal to obtain a demodulated signal which does not include multipath distortion.

8. A method of eliminating waveform distortion as claimed in claim 7, wherein said step of producing said first signal comprises the steps of: producing a squared angle modulated signal in accordance with said gain controlled angle modulated signal; and passing only the low-frequency component of said squared angle modulated signal.

9. A method of eliminating waveform distortion as claimed in claim 7, wherein said step of producing said first signal comprises the step of: producing an amplitude demodulated signal in accordance with said gain controlled angle modulated signal; and passing only the low-frequency component of said amplitude demodulated signal.

10. A method of eliminating waveform distortion as claimed in claim 7, wherein said step of shifting said occupied-frequency of said AC component of said first signal comprises the step of: single sideband modulating.

11. Apparatus for enabling elimination of multipath distortion of an angle modulated input signal having a relatively constant average envelope amplitude comprising means responsive to the input signal for angle demodulating the input signal and deriving a demodulated signal, means responsive to the input signal for deriving a compensating signal having an amplitude proportional to:

$$\frac{K\{f'(t) - f'(t - \tau)\} \cos\{f(t) - f(t - \tau) + \theta\}}{\{Env(t)\}^2 - K^2}$$

where
 K is an interference ratio between direct and indirect waves forming the multipath interference,
 f(t) is the modulation on the input signal,
 $\tau$ is the delay time of the indirect wave relative to the direct wave,
 $\theta$ is the phase angle delay of the carrier of the indirect wave relative to the direct wave,
 Env(t) is the instantaneous variation of the envelope of the input signal,
 f'(t) and f'(t−$\tau$) are respectively the first derivatives with respect to f(t) and f(t−$\tau$), and means for linearly combining the demodulated and compensating signals to substantially eliminate amplitude variations of the demodulated signal due to multipath distortion.

12. The apparatus of claim 11 wherein the compensating signal deriving means includes means responsive to the input signal for deriving a first signal having an amplitude proportional to:

$$f'(t)-f'(t-\tau),$$

means responsive to the input signal for deriving a second signal having an amplitude proportional to:

$$\frac{K \cdot Elm(t)}{1 + 2K \cdot Elm(t)}$$

where Elm(t) is proportional to the AC component of the input signal envelope, and means for multiplying the amplitudes of the first and second signals together to derive the compensating signal.

13. Apparatus for enabling elimination of multipath distortion of an angle modulated input signal having a relatively constant average envelope amplitude comprising means responsive to the input signal for angle demodulating the input signal and deriving a demodulated signal, means responsive to the input signal for deriving a first signal having an amplitude E(t) commensurate only with AC components of the input signal envelope, means responsive to the first signal for deriving a second signal having an amplitude proportional to the time derivative of time varying components within an AC component of the first signal, means responsive to the first signal for deriving a third signal having an amplitude proportional to:

$$\frac{E(t)}{1 + 2E(t)},$$

means for non-linearly combining said second and third signals to derive a signal representing multipath distortion on the demodulated signal amplitude, and means for linearly combining the demodulated and multipath distortion representing signals to substantially eliminate the multipath distortion from the demodulated signal.

14. The apparatus of claim 13 wherein the second signal deriving means includes single sidehband modulator means responsive to the first signal for shifting the frequency of the first signal, and frequency modulation demodulator means responsive to the frequency shifted signal for deriving the second signal.

15. The apparatus of claim 13 wherein the first signal deriving means includes means for deriving the first signal as a signal having an amplitude linearly proportional to the amplitude of AC components of the input signal amplitude.

16. The apparatus of claim 13 wherein the first signal deriving means includes means for deriving the first signal as a signal having an amplitude linearly proportional to the square of the amplitude of AC components of the input signal amplitude.

* * * * *